(12) United States Patent
Convers

(10) Patent No.: US 7,518,385 B2
(45) Date of Patent: Apr. 14, 2009

(54) PROBE USING HIGH PASS GROUND SIGNAL PATH

(75) Inventor: Philippe Convers, Elmwood Park, NJ (US)

(73) Assignee: LeCray Corporation, Chestnut Ridge, NY (US)

( * ) Notice: Subject to any disclaimer, the term of this patent is extended or adjusted under 35 U.S.C. 154(b) by 0 days.

(21) Appl. No.: 11/478,463

(22) Filed: Jun. 29, 2006

(65) Prior Publication Data

US 2008/0001611 A1    Jan. 3, 2008

(51) Int. Cl.
*G01R 31/28* (2006.01)
(52) U.S. Cl. .................................... 324/754
(58) Field of Classification Search ............... 324/754, 324/761–762, 765, 158.1, 72.5; 333/172; 379/390.02, 406.08; 327/311
See application file for complete search history.

(56) References Cited

U.S. PATENT DOCUMENTS

| | | | |
|---|---|---|---|
| 3,532,982 A * | 10/1970 | White et al. ............. 324/121 R |
| 6,175,228 B1 * | 1/2001 | Zamborelli et al. ......... 324/72.5 |
| 6,362,614 B2 * | 3/2002 | Draving ...................... 324/72.5 |
| 6,791,434 B2 * | 9/2004 | Tsujiguchi ................... 333/172 |
| 7,019,544 B1 | 3/2006 | Jacobs et al. |
| 7,170,349 B2 * | 1/2007 | Bhattacharjee et al. ...... 330/254 |

OTHER PUBLICATIONS

"D500PT 6 GHz Differential Positioner Mounted Probe Tip Module", *LeCroy Corporation*, Marketing Sales Release (MSR),(Jul. 8, 2005), 1-2.

Williams, Jim , "High Speed Amplifier Techniques; A Designer's Companion for Wideband Circuitry", *Linear Technology Application Note 47 (AN47)*, (Aug. 1991),AN47-1-AN47-132.

* cited by examiner

*Primary Examiner*—Ha Tran T Nguyen
*Assistant Examiner*—Tung X. Nguyen
(74) *Attorney, Agent, or Firm*—Gordon Kessler

(57) ABSTRACT

A method and apparatus for probing an electrical signal. The apparatus comprises simplified circuit, comprising an input pin for receiving an input signal having an inductance and parasitic capacitance associated therewith and a first resistor coupled between the input pin and an output. A first capacitor is coupled between the first resistor and the output, and a ground. A second capacitor and an associated inductance in series are coupled between the junction of the first resistor and first capacitor and a parallel circuit arrangement. The parallel circuit comprises a second resistor and second associated inductance coupled in parallel between the first inductor and ground.

13 Claims, 6 Drawing Sheets

PROBE USING HIGH PASS GROUND SIGNAL PATH

BACKGROUND OF THE INVENTION

The present invention relates to the field of electrical test probes. More particularly, the present invention relates to an active differential test probe with a transmission line input structure.

An electrical signal will change when a test instrument, such as an oscilloscope, is connected to the circuit that generates the signal. For example, if a bare wire is connected between a circuit and an oscilloscope, the wire and the input circuitry of the oscilloscope effectively add a load resistance and a shunt capacitance to the circuit. This reduces the measured voltage and affects measurements of dynamic timing characteristics, such as pulse rise time. For this reason, a test probe that minimizes the loading effects on the circuit is generally used when a test instrument is connected to a circuit. Several general types of test probes have been developed.

With a high-impedance test probe, it is possible to take a small sample of the signal without appreciably loading the circuit being measured. A high-impedance test probe consists of a large value resistor and an input capacitor coupled, in parallel, to a test point in the circuit. A high-impedance test probe, however, is not suited for high-frequency measurements because of the relatively high value of its input capacitance.

A low-impedance test probe is better suited for measurement of high frequency signals. A low-impedance test probe consists of a low-value input resistor in series with the signal conductor of a low-loss coaxial cable that is treated as a terminated transmission line. One limitation of the low-impedance test probe is that it may be used only at a test point with a relatively low source resistance. Another disadvantage is that the low-impedance test probe is a single ended test probe. An additional limitation of the low-impedance test probe is that the frequency is limited to the resonant frequency of the probe input capacitance in series with the ground lead and probe tip inductance.

Probing of high speed electrical signals has long been a challenge for designers of electronic test equipment. As signal speeds increase, test equipment must similarly increase in speed to keep up. The interface between the electrical signal and the test equipment is the probe. Ideally, the probe would transmit the received electrical, without acting upon it at all, to the associated electronic test equipment. However, because the probe has physical properties associated with it, this ideal situation cannot physically be achieved.

In particular, a number of different elements within a probe generate various capacitances and inductances that act upon the electronic signal being transmitted. As the electronic signal speed increases, the effects of these elements are more pronounced.

Therefore, it would be beneficial to provide a probing solution that allowed for probing of high speed signals while reducing the effect of the probe on the electronic signal being transmitted.

SUMMARY OF THE INVENTION

FIG. 1 shows a diagram and FIG. 2 an equivalent circuit of a known high impedance passive differential probe, which has been recognized by the inventor of the present invention as having a number of drawbacks. Circuits of this type are shown, for example, in U.S. Pat. No. 7,019,544, issued Mar. 28, 2006 to Jacobs, et al., "Transmission Line Input Structure Test Probe", the entire contents thereof being incorporated herein by reference. L1 represents the inductance of a test pin IN_n, which is connected in series with a high value resistor R1. A parallel, differential input comprises an input on test pin IN_p, which includes an inductance L2, and which is connected in series with a high value resistor R2. A pair of signals received via test pins IN_n and IN_p are then passed, via corresponding transmission lines T1 and T2. The transmission lines include an open ground on the probe tip side, and may comprise printed circuits on a common substrate forming a housing or the like, or other physical manifestations of probe tips known in the art. The housing may be formed of a conductive material, but is preferably isolated from the transmission lines. The proximity of the various electric components and the conductive housing may generate various parasitic capacitances, the housing acting as a ground plane. Parasitic capacitances Cp1 between an end of the ground and the top of test pin IN_n, and Cp2 between an end of the ground and the top of test pin IN_p, are generated and shown in FIG. 2. Because the L1 and Cp1 elements (and also the Cp2 and L2 elements) generate some peaking in the frequency response of the probe, a corresponding capacitor C1 (and C2) are provided between the corresponding transmission lines and housing to compensate for the peaking.

The inventor of the present invention has recognized a number of factors that limit the maximum bandwidth of the signal that this design can properly receive and transmit. In particular, the longer the test pins are, the higher the pin inductances (L1, L2) will be, and in turn the lower the bandwidth of the probe. Further self resonance within each of the pins may create a dip at the corresponding resonance frequency in the response of the probe. Because the floating ground end of the transmission lines T1, T2 makes these lines act as a series inductance on the ground path, the bandwidth of the probe will be limited in a manner inversely proportional with the length of these transmission lines.

Therefore, in accordance with the invention, the inventor has proposed a new circuit design in which an additional capacitor and resistor are employed in conjunction with each test pin to reduce the unwanted effects of the circuits within the probe.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
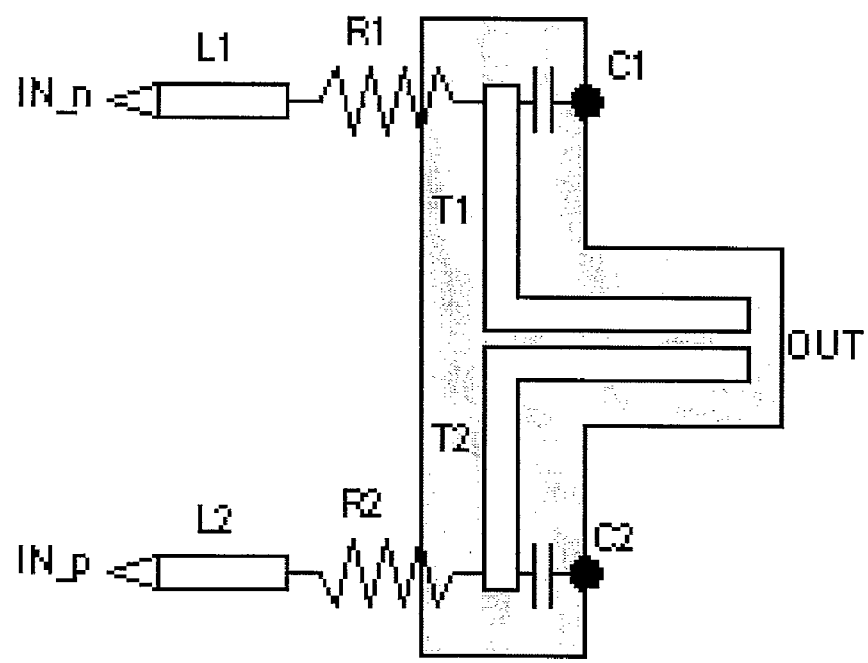
FIG. 1 is a block diagram of a conventional differential probe.
Figure 2:
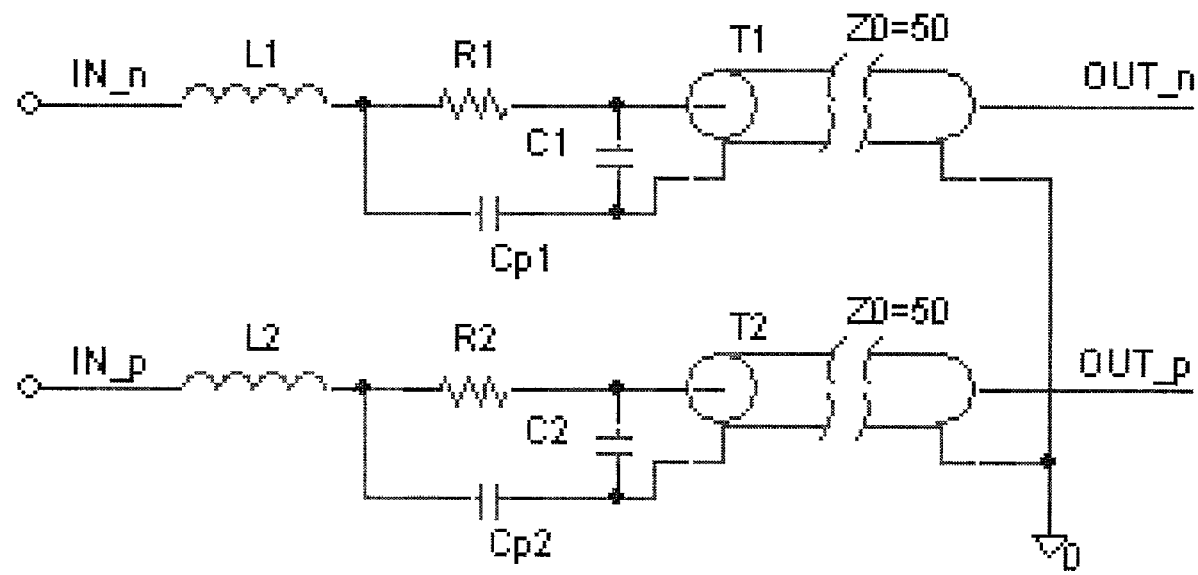
FIG. 2 is a circuit diagram corresponding to the probe of FIG. 1.
Figure 3:
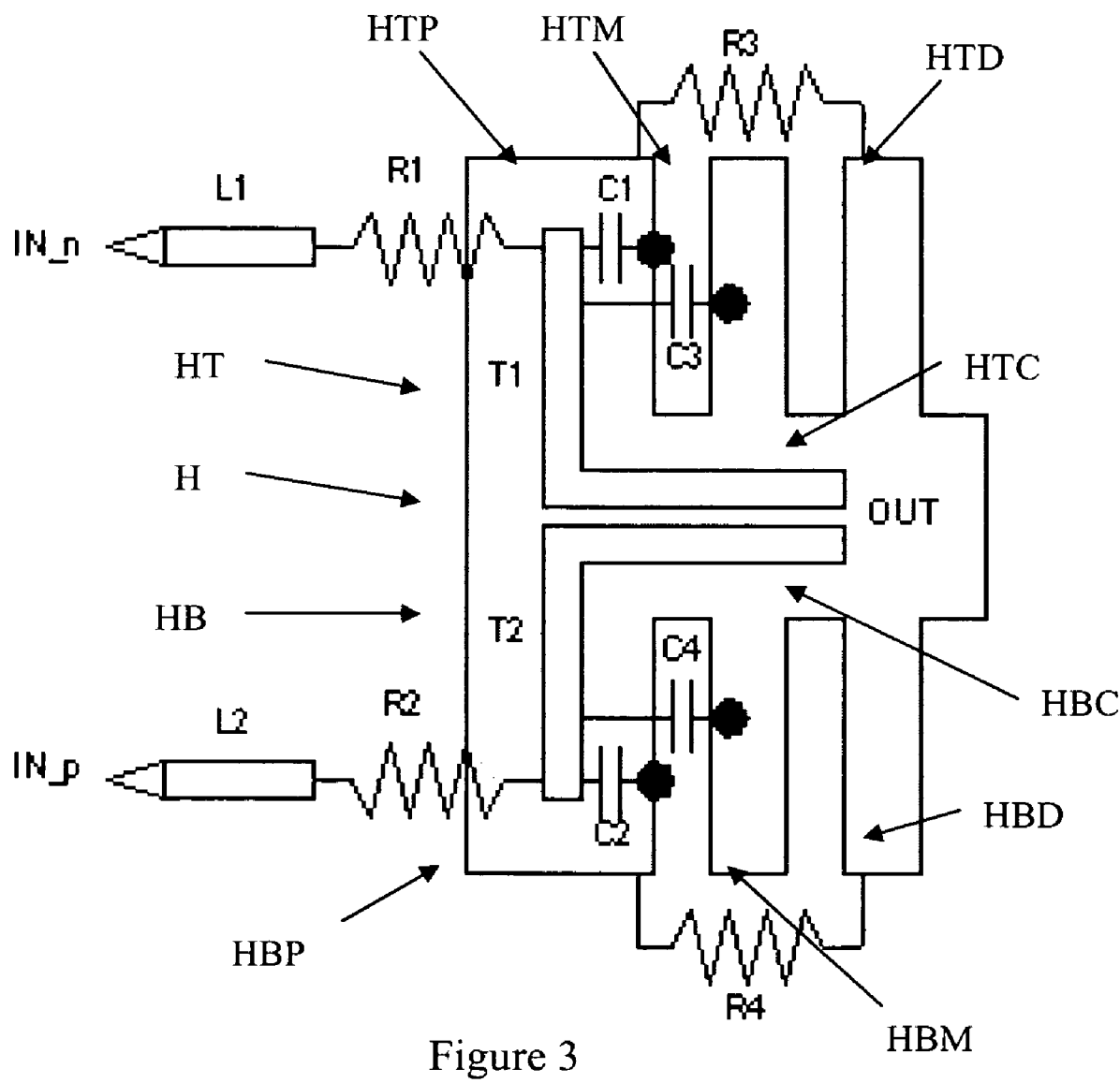
FIG. 3 is a block diagram of a differential probe constructed in accordance with an embodiment of the invention.
Figure 4:
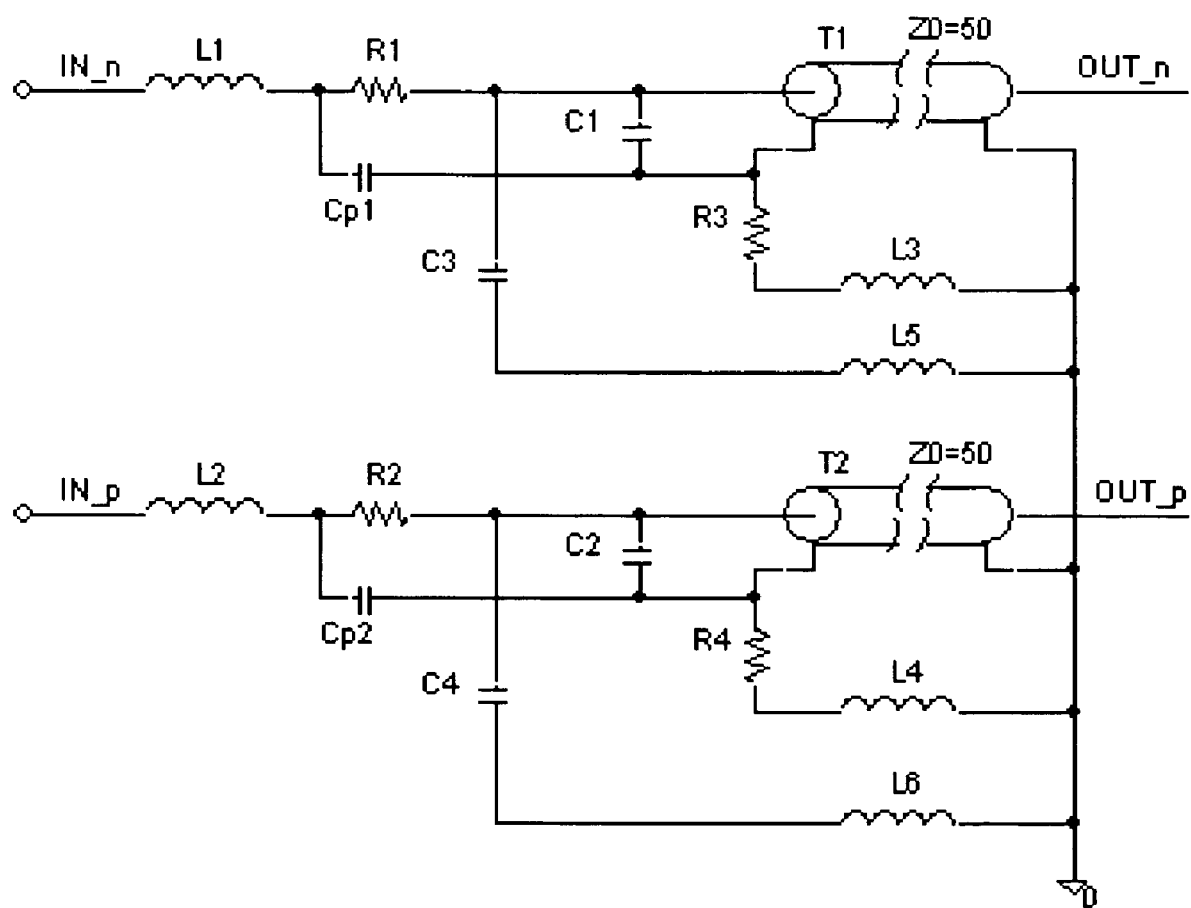
FIG. 4 is a circuit diagram corresponding to the probe of FIG. 3.

Referring next to FIGS. 3 and 4, a block diagram and equivalent circuit diagram constructed in accordance with an embodiment of the invention are shown. In accordance with the invention, additional capacitors C3 and C4 and additional resistors R3 and R4 have been added to the configuration depicted in FIGS. 1 and 2. Additionally depicted in FIG. 4 are inductances L3-L6 associated with the newly added elements.

As is shown in FIG. 3, the probe is preferably formed with a housing H having a top section HT and a bottom section HB, each of the top and bottom sections further comprising a distal portion HTD, HBD, a medial portion HTM, HBM, a proximal portion HTP, HBP and a connecting portion HTC, HBC, these portions of the housing preferably all being electrically coupled. A first transmission line T1 is positioned within the top section of the housing and isolated therefrom, the transmission line being further positioned within the proximal portion and the connecting portion of the top section of the housing. A second transmission line T2 is positioned within the bottom section of the housing and isolated therefrom, the transmission line being further positioned within the proximal portion and the connecting portion of the bottom section of the housing. The circuitry described above is therefore coupled with the noted portions of the housing and other portions of the circuit. While a number of the components, such as C3 and R3 are shown connected to particular portions of the housing, changing these connecting points is possible. Thus for example, one end of C3 may be connected to HTD, which one end of R3 may be connected to HTM. As long as moves of this sort are mutually compensating, such changes are possible. These changes may be desirable based upon an actual positioning of elements in a particular physical construction. Furthermore one or more components such as R3 or C1 may be removed. The inventor has discovered that while this may degrade performance, the function is still preferable to conventional design.

Figure 5:
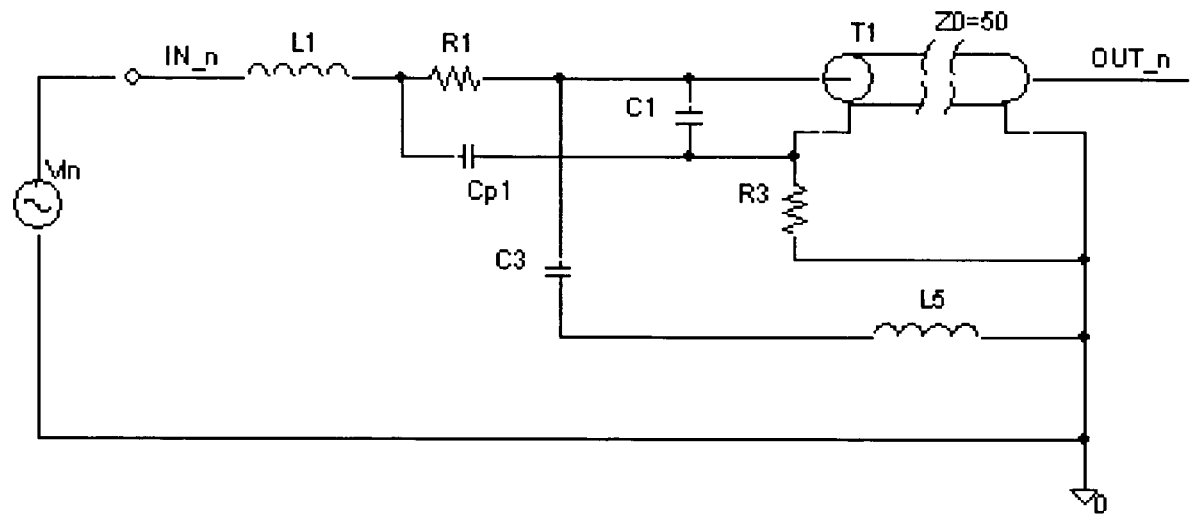
FIG. 5 is a transformed version of the circuit diagram of FIG. 4.
Figure 6:
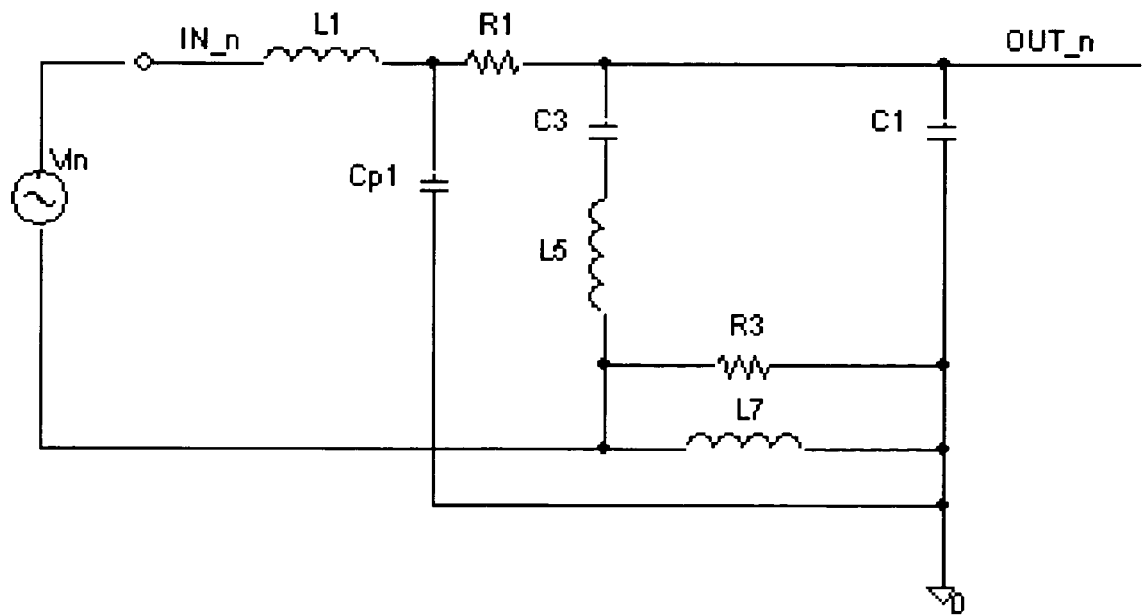
FIG. 6 is a further transformed version of the circuit diagram of FIG. 5.

In order to simplify explanation of the functioning of the circuit, first the circuit of FIG. 4 is transformed. As is shown in FIG. 5, first only one side of the differential probe is considered. It should be assumed that a virtual ground on the symmetry plane exists. While only one side is shown, the invention is intended to include both a single ended and differential designs. In FIG. 5 Vin is the input voltage, connected between the test pin and the virtual ground. L3 has also been removed from the circuit drawing because its impedance is practically negligible as compared to R3. If a further assumption is made that the transmission line is not lossy and preferably drives a perfect 50 ohm load (or other value, as long as it is matched to the impedance of the transmission line), the amplitude of the signal will be the same if it is measured between the input of the line and its floating ground terminal as it is on the load. So it is possible to shift the output port to the input of the line, set the floating ground port as the reference ground and replace the line by an equivalent inductance L7 linking the new reference ground and the original ground. A new equivalent circuit is shown in FIG. 6.

In this circuit there are now two signal paths. The first path passes through L1 and R1, and is similar in design to that included in classic probe design, and passes a lower frequency portion of the signal. The second path originates from the ground terminal of the source and goes through C3 and L5. These components form a high pass filter that allows the frequencies higher than the main path's bandwidth to pass through. Coming from the ground terminal of the source, these frequencies comprise a signal having an opposite phase from the main signal. Thus, a circuit formed by C3, L5, L7 and R3 create a phase shift in the frequency band of interest. In this manner, the recombined signal has the correct phase at the junction where the low and high bandwidth signals are combined.

Figure 7:
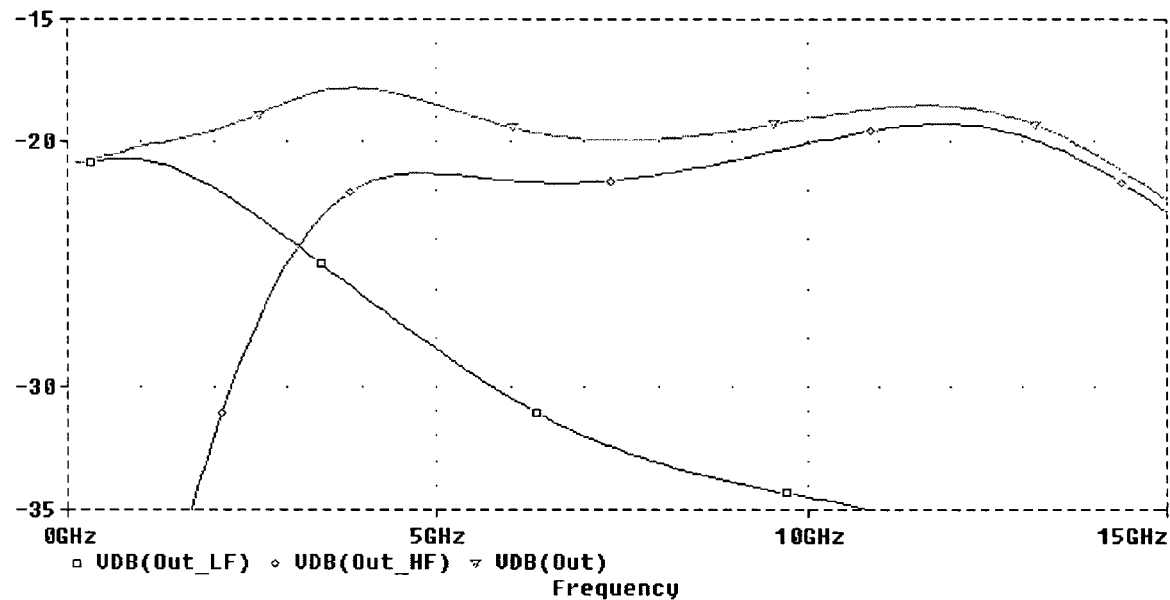
FIG. 7 is a graph depicting an overall system response in accordance with the invention.

In accordance with the invention, the inventive method and circuit doubles or perhaps even triples the bandwidth reachable for a given probe tip geometry, as compared to a standard design circuit. FIG. 7 shows an example with Out_LF comprising a low frequency (standard) contribution that would be provided with a conventional probing circuit. Out_HF comprises an additional high frequency contribution provided in accordance with the inventive circuit of the present invention. The combination of these two signals result in Out, the total system response. This example of FIG. 7 employs a 50 ohm transmission line to connect the probe tip to the amplifier. However, the circuit will work similarly if a different amplifier, a different impedance, or even if a direct connection is employed between the probe tip and the amplifier.

Figure 8:
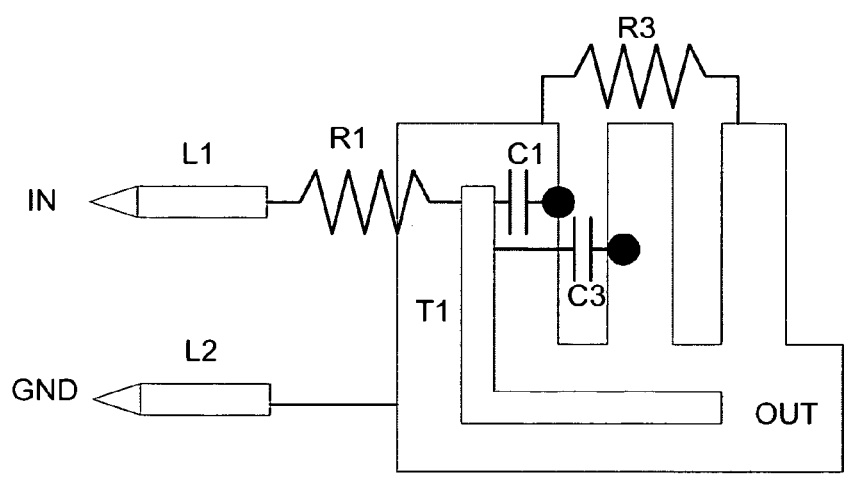
FIG. 8 is a block diagram of a single ended probe constructed in accordance with an embodiment of the invention.

While the invention is shown in accordance with a differential probe, the concept and circuit would be equally applicable to a single-ended probe. The configuration shown on FIG. 8 is a block representation of a single ended version of the probe tip depicted in FIG. 1. Instead of the second input, a ground pin that connects the grounds is employed.

Figure 9:
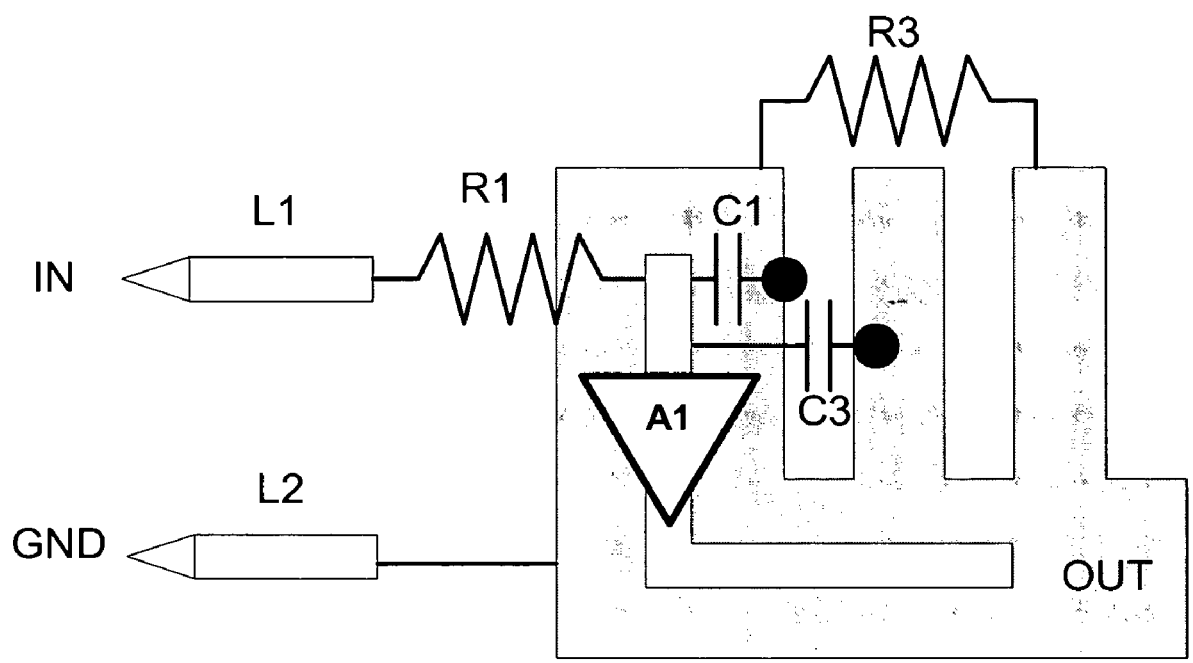
FIG. 9 is a block diagram of a single ended probe employing an active element constructed in accordance with the invention.

In FIG. 9, an amplifier is employed before the transmission line. If the input impedance of the amplifier is low, the theory of operation is the same as in the embodiments noted above. Such an amplifier can also be used on any differential probe designs.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A probing apparatus for probing an electrical signal, comprising:

a housing having a top section and a bottom section, each of the top and bottom sections further comprising a distal portion, a medial portion, a proximal portion and a connecting portion;

a first transmission line positioned within the top section of the housing, the transmission line being further positioned within the proximal portion and the connecting portion of the top section of the housing;

a second transmission line positioned within the bottom section of the housing, the transmission line being further positioned within the proximal portion and the connecting portion of the bottom section of the housing;

a first input pin having a first inductance associated therewith;

a first resistor coupling the first input pin with the first transmission line;

a first capacitor coupling the first transmission line with an outer wall of the proximal portion of the top section of the housing;

a second capacitor coupling the first transmission line with the medial portion of the top section of the housing;

a second resistor coupling the proximal and distal portions of the top section of the housing;

a second input pin having a second inductance associated therewith;

a third resistor coupling the second input pin with the second transmission line;

a third capacitor coupling the second transmission line with an outer wall of the proximal portion of the bottom section of the housing;

a fourth capacitor coupling the second transmission line with the medial portion of the bottom section of the housing; and a fourth resistor coupling the proximal and distal portions of the bottom section of the housing.

2. The probing apparatus of claim 1, wherein the first and second transmission lines comprise printed circuits.

3. The probing apparatus of claim 2, wherein the first and second transmission lines are printed on the housing.

4. The probing apparatus of claim 1, wherein an end of each of the first and second transmission lines is fed to a probe output.

5. The probing apparatus of claim 4, wherein the probe output is electrically coupled to an input of a test device.

6. The probing apparatus of claim 1, further comprising an amplifier positioned along the first transmission line.

7. The probing apparatus of claim 6, further comprising an amplifier positioned along the second transmission line.

8. A circuit for use in an electrical probing apparatus, the circuit comprising a combination of elements simplifying to a circuit, comprising:

a first portion of a circuit, comprising:

an input pin for receiving an input signal having an inductance and parasitic capacitance associated therewith;

a first resistor coupled between the input pin and an output;

a first capacitor coupled between the first resistor and the output, and a ground; and a second capacitor and an associated inductance in series coupled between the junction of the first resistor and first capacitor and a parallel circuit arrangement, the parallel circuit comprising a second resistor and second associated inductance coupled in parallel between the first inductor and ground; and a second, mirrored portion of the circuit to provide a second output.

9. The circuit of claim 8, wherein the first and second portions of the circuit comprise a differential probe architecture.

10. A method for sampling a plurality of electrical signals in a circuit and generating a differential signal, comprising the steps of:

providing a housing having a top section and a bottom section, each of the top and bottom sections further comprising a distal portion, a medial portion, a proximal portion and a connecting portion;

providing a first transmission line positioned within the top section of the housing, the transmission line being further positioned within the proximal portion and the connecting portion of the top section of the housing;

providing a second transmission line positioned within the bottom section of the housing, the transmission line being further positioned within the proximal portion and the connecting portion of the bottom section of the housing;

providing a first input pin having a first inductance associated therewith;

providing a first resistor coupling the first input pin with the first transmission line;

providing a first capacitor coupling the first transmission line with an outer wall of the proximal portion of the top section of the housing;

providing a second capacitor coupling the first transmission line with the medial portion of the top section of the housing;

providing a second resistor coupling the proximal and distal portions of the top section of the housing;

providing a second input pin having a second inductance associated therewith;

providing a third resistor coupling the second input pin with the second transmission line;

providing a third capacitor coupling the second transmission line with an outer wall of the proximal portion of the bottom section of the housing;

providing a fourth capacitor coupling the second transmission line with the medial portion of the bottom section of the housing;

providing a fourth resistor coupling the proximal and distal portions of the bottom section of the housing;

receiving an input signal at the first and second input pins, and providing a differential output signal at an output of the first and second transmission lines.

11. The method of claim 10, further comprising the steps of:

coupling the first input pin to a first test point; and
coupling the second input pin to a second test point.

12. The method of claim 10, wherein the combination of the second resistor and associated inductance, and the second resistor and the associated inductance create a phase shift in a signal passing therethrough.

13. The method of claim 12, wherein portions of the signal combined at the output pin are substantially in phase.

* * * * *